(12) United States Patent
Takeuchi et al.

(10) Patent No.: US 9,036,443 B2
(45) Date of Patent: May 19, 2015

(54) INTEGRATED CIRCUIT DEVICE

(75) Inventors: Ken Takeuchi, Tokyo (JP); Teruyoshi Hatanaka, Tokyo (JP); Koichi Ishida, Tokyo (JP); Tadashi Yasufuku, Tokyo (JP); Makoto Takamiya, Tokyo (JP); Takayasu Sakurai, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 8 days.

(21) Appl. No.: 14/118,464

(22) PCT Filed: May 11, 2012

(86) PCT No.: PCT/JP2012/062175
§ 371 (c)(1),
(2), (4) Date: Nov. 18, 2013

(87) PCT Pub. No.: WO2012/157569
PCT Pub. Date: Nov. 22, 2012

(65) Prior Publication Data
US 2014/0104952 A1    Apr. 17, 2014

(30) Foreign Application Priority Data

May 18, 2011  (JP) .................................. 2011-111660

(51) Int. Cl.
| | |
|---|---|
| *G11C 5/14* | (2006.01) |
| *H02M 3/155* | (2006.01) |
| *G11C 16/06* | (2006.01) |
| *G11C 16/26* | (2006.01) |
| *G11C 16/34* | (2006.01) |
| *H02M 3/158* | (2006.01) |
| *G11C 16/30* | (2006.01) |
| *H02M 1/00* | (2006.01) |

(52) U.S. Cl.
CPC .............. *H02M 3/155* (2013.01); *G11C 16/06* (2013.01); *G11C 16/26* (2013.01); *G11C 16/3418* (2013.01); *H02M 3/158* (2013.01); *H02M 2001/007* (2013.01); *G11C 16/30* (2013.01)

(58) Field of Classification Search
USPC ........................................... 365/226; 327/537
See application file for complete search history.

(56) References Cited

U.S. PATENT DOCUMENTS

| | | | | |
|---|---|---|---|---|
| 2008/0067647 | A1* | 3/2008 | Fukuda .......................... | 257/676 |
| 2011/0260781 | A1* | 10/2011 | Takeuchi et al. .............. | 327/537 |
| 2011/0298534 | A1* | 12/2011 | Takeuchi et al. .............. | 327/581 |

FOREIGN PATENT DOCUMENTS

| | | |
|---|---|---|
| JP | A-2008-071935 | 3/2008 |
| JP | A-2008-206317 | 9/2008 |
| WO | WO 2010/047140 A1 | 4/2010 |

OTHER PUBLICATIONS

Park et al., "A High Performance Controller for NAND Flash-based Solid State Disk (NSSD)," IEEE Non-Volatile Semiconductor Memory Workshop, Feb. 2006, pp. 17-20.
International Preliminary Report on Patentability Issued in Application No. PCT/JP2012/062175; Dated Nov. 19, 2013 (With Translation).

* cited by examiner

*Primary Examiner* — Anthan Tran
(74) *Attorney, Agent, or Firm* — Oliff PLC

(57) ABSTRACT

A booster circuit is configured, such that: in response to a reading request for reading data from a flash memory, when a voltage of an output terminal detected by a voltage detection circuit is not higher than a voltage, an oscillator outputs a control clock signal of predetermined on time and off time to a transistor of a boost converter to perform switching control of the transistor; and when the voltage detection circuit detects that the voltage of the output terminal reaches a voltage, an oscillator outputs a control clock signal of an on time and an off time input from a selection circuit to a transistor of a boost converter to perform switching control of the transistor.

8 Claims, 5 Drawing Sheets

INTEGRATED CIRCUIT DEVICE

TECHNICAL FIELD

The present invention relates to an integrated circuit device and more specifically to an integrated circuit device that includes: an integrated circuit chip equipped with an integrated circuit; and an interposer equipped with a booster supply circuit which is capable of boosting up a power source voltage supplied from a power source side and supplying the boosted-up voltage to the integrated circuit of the integrated circuit chip.

BACKGROUND ART

This type of the integrated circuit device has been proposed to include a plurality of flash memory chips, each being equipped with a flash memory, where the flash memory of each flash memory chip is divided into a plurality of banks and data is read and written in parallel from the respective flash memory chips while being read and written by memory interleaving (see, for example, Non Patent Literature 1). This proposed device enables high-speed data reading and writing by this operation.

CITATION LIST

Non Patent Literature

[NPL 1] Chanik Park, Prakash Talawar, Daesik Won, MyungJin Jung, JungBeen Im, Suksan Kim and Youngjoon Choi, [A High Performance Controller for NAND Flash-based Solid State Disk (NSSD)], IEEE Non-Volatile Semiconductor Memory Workshop, pp. 17-20, February 2006

SUMMARY OF INVENTION

The above flash memory requires a relatively high voltage for data reading and writing. In the integrated circuit device equipped with the integrated circuit that operates at such a relatively high voltage, a booster supply circuit including a boost converter configured to boost up the supplied voltage accompanied with switching a field-effect transistor is used to boost up a relatively low power source voltage and supply the boosted-up voltage to the integrated circuit. In this booster supply circuit, it is demanded to quickly boost up the power source voltage to an operating voltage required for operating the integrated circuit. A heavy load for boost-up, however, does not enable the power source voltage to be quickly boosted up to the operating voltage. One available technique of quickly boosting up the power source voltage to the operating voltage decreases the threshold voltage of the filed-effect transistor. This technique, however, decreases the withstanding-voltage level of the field-effect transistor. A voltage exceeding the withstanding-voltage level may be applied to the field-effect transistor in the boost-up process. This fails to protect the field-effect transistor and thereby results in failed protection of the device.

The main object of the integrated circuit device of the invention is to boost up the power source voltage more quickly and supply the boosted-up voltage to the integrated circuit, while ensuring protection of the device.

The integrated circuit device of the invention has the following configurations, in order to achieve the above main object.

There is provided an integrated circuit device that comprises: an integrated circuit chip equipped with an integrated circuit; and an interposer equipped with a booster supply circuit which is capable of boosting up a power source voltage supplied from a power source side and supplying the boosted-up voltage to the integrated circuit of the integrated circuit chip, wherein the booster supply circuit comprises: a first boost converter configured to include: a first inductor connected in series between a first input terminal receiving a supply of the power source voltage and a first output terminal outputting a voltage; a first rectifying element connected in series between the first inductor and the first output terminal and configured to rectify electric current in a direction from the first input terminal toward the first output terminal; and a first field-effect transistor placed between the first inductor and the first rectifying element and connected in parallel with the first output terminal viewed from the first inductor; a second boost converter configured to include: a second inductor connected in series between a second input terminal receiving an input of the voltage of the first output terminal of the first boost converter and a second output terminal supplying a voltage to the integrated circuit of the integrated circuit chip; a second rectifying element connected in series between the second inductor and the second output terminal and configured to rectify electric current in a direction from the second input terminal toward the second output terminal; and a second field-effect transistor placed between the second inductor and the second rectifying element, connected in parallel with the second output terminal viewed from the second inductor and configured to have a higher threshold voltage than the first field-effect transistor and withstand a voltage of not lower than a predetermined operating voltage as a voltage which the integrated circuit operates; and a switching control circuit configured to perform switching control of the first field-effect transistor of the first boost converter to make the voltage of the first output terminal equal to a predetermined low voltage, which is specified in advance as a lower voltage than the operating voltage, when the voltage of the first output terminal of the first boost converter is not higher than the predetermined low voltage, and to perform switching control of the second field-effect transistor of the second boost converter to make the voltage of the second output terminal of the second boost converter equal to the operating voltage after the voltage of the first output terminal of the first boost converter reaches the predetermined low voltage.

In the integrated circuit device of the invention, the second field-effect transistor of the second boost converter is structured as a transistor that has the higher threshold voltage than that of the first field-effect transistor of the first boost converter and withstands the voltage of not lower than the predetermined operating voltage as the voltage which the integrated circuit operates. When the voltage of the first output terminal of the first boost converter is not higher than the predetermined low voltage specified in advance as the lower voltage than the operating voltage, the first field-effect transistor of the first boost converter is subjected to switching control to make the voltage of the first output terminal equal to the predetermined low voltage. The threshold voltage of the first field-effect transistor of the first boost converter is lower than the threshold voltage of the second field-effect transistor of the second boost converter. Compared with a boost converter using the second field-effect transistor in place of the first field-effect transistor, the first boost converter can more quickly boost up the voltage of the first output terminal of the first boost converter to the predetermined low voltage. After the voltage of the first output terminal of the first boost converter reaches the predetermined low voltage, the second field-effect transistor of the second boost converter is subjected to switching control to make the voltage of the second output terminal of the second boost converter equal to the operating voltage. The second field-effect transistor of the second boost converter is structured as a transistor that has the higher threshold voltage than that of the first field-effect transistor of the first boost converter and withstands the operating voltage. This enables the voltage of the second output terminal of the second boost converter to be boosted up to the operating voltage and supplied to the integrated circuit of the integrated circuit chip, while ensuring the voltage-withstanding. This accordingly enables the power source voltage to be more quickly boosted up and supplied to the integrated circuit, while ensuring protection of the device.

In this integrated circuit device of the invention, the switching control circuit may comprise: a first voltage detection circuit configured to detect the voltage of the first output terminal of the first boost converter; a second voltage detection circuit configured to detect the voltage of the second output terminal of the second boost converter; and a control clock signal generating circuit configured: to generate a control clock signal of predetermined first on time and first off time and perform switching control of the first field-effect transistor by using the generated clock signal, when the detected voltage of the first output terminal of the first boost converter is not higher than the predetermined low voltage; and to generate a control clock signal of predetermined second on time and second off time and perform switching control of the second field-effect transistor using the generated clock signal, after the detected voltage of the first output terminal of the first boost converter reaches the predetermined low voltage.

In the integrated circuit device of the invention, the switching control circuit may comprise: a first voltage detection circuit configured to detect the voltage of the first output terminal of the first boost converter; a second voltage detection circuit configured to detect the voltage of the second output terminal of the second boost converter; an on time setting circuit configured to set an on time of a control clock signal such that a longer on time is set corresponding to a longer elapsed time since the detected voltage of the first output terminal of the first boost converter has reached the predetermined low voltage, until the detected voltage of the second output terminal of the second boost converter reaches the operating voltage, after the detected voltage of the first output terminal of the first boost converter reaches the predetermined low voltage; and a control clock signal generating circuit configured: to generate a control clock signal of predetermined first on time and first off time and perform switching control of the first field-effect transistor by using the generated clock signal, when the detected voltage of the first output terminal of the first boost converter is not higher than the predetermined low voltage; and to generate a control clock signal of the on time set by the on time setting circuit and a predetermined second off time and perform switching control of the second field-effect transistor using the generated clock signal, until the detected voltage of the second output terminal of the second boost converter reaches the operating voltage, after the detected voltage of the first output terminal of the first boost converter reaches the predetermined low voltage. The higher voltage of the second output terminal of the second boost converter is expected to cause the greater energy loss of the second field-effect transistor in the boost-up process and result in the insufficient boost-up in the case of the short on time of the control clock signal. After the detected voltage of the first output terminal of the first boost converter reaches the predetermined low voltage, the on time of the control clock signal is set such that the longer on time is set corresponding to the longer elapsed time since the detected voltage of the first output terminal of the first boost converter has reached the predetermined low voltage, until the detected voltage of the second output terminal of the second boost converter reaches the operating voltage. Until the detected voltage of the second output terminal of the second boost converter reaches the operating voltage, the control clock signal of the on time set by the on time setting circuit and the predetermined second off time is generated, and the second field-effect transistor is subjected to switching control using the generated clock signal. This enables the voltage of the second output terminal to be more adequately boosted up to the operating voltage.

The integrated circuit device of the invention may further include a smoothing capacitor configured to smoothen the voltage of the first output terminal of the first boost converter.

The integrated circuit device of the invention may further comprise: a third boost converter configured to include: a third inductor connected in series between a third input terminal receiving a voltage supply from the power source voltage and a third output terminal outputting a voltage to the integrated circuit of the integrated circuit chip; a third rectifying element connected in series between the third inductor and the third output terminal and configured to rectify electric current in a direction from the third input terminal toward the third output terminal; and a third field-effect transistor placed between the third inductor and the third rectifying element and connected in parallel with the third output terminal viewed from the third inductor; wherein the integrated circuit is capable of operating in a first mode that operates with the operating voltage set to a first control voltage and in a second mode that operates with the operating voltage set to a second control voltage higher than the first control voltage; and wherein in response to an instruction for operating the integrated circuit in the first mode, when the voltage of the first output terminal of the first boost converter is not higher than the predetermined low voltage, the switching control circuit performs switching control of the first field-effect transistor of the first boost converter to make the voltage of the first output terminal equal to the predetermined low voltage; and after a detected voltage of the first output terminal of the first boost converter reaches the predetermined low voltage, the switching control circuit performs switching control of the second field-effect transistor of the second boost converter to make a detected voltage of the second output terminal of the second boost converter equal to the first control voltage; and in response to an instruction for operating the integrated circuit in the second mode, the switching control circuit performs switching control of the third field-effect transistor of the third boost converter to make a detected voltage of the third output terminal of the third boost converter equal to the second control voltage. In response to the instruction for operating the integrated circuit in the first mode, when the voltage of the first output terminal of the first boost converter is not higher than the predetermined low voltage, the first field-effect transistor of the first boost converter is subjected to switching control to make the voltage of the first output terminal equal to the predetermined low voltage. After the detected voltage of the first output terminal of the first boost converter reaches the predetermined low voltage, the second field-effect transistor of the second boost converter is subjected to switching control to make the detected voltage of the second output terminal of the second boost converter equal to the first control voltage. This enables the power source voltage to be more quickly boosted up to the first control voltage and supplied to the integrated circuit, while ensuring protection of the device. In response to the instruction for operating the integrated circuit in the second mode, on the other hand, the third field-effect transistor of the third boost converter is subjected to switching control to make the detected voltage of the third output terminal of the third boost converter equal to the second control voltage. This enables the power source voltage to be boosted up to the second control voltage and supplied to the integrated circuit, while ensuring protection of the device.

In the integrated circuit device of the invention according to the embodiment including the third boost converter, the third field-effect transistor may be structured as a transistor that withstands a voltage of not lower than the second control voltage. This ensures voltage-withstanding of the transistor and thereby ensures protection of the device.

In the integrated circuit device of the invention according to the embodiment including the third boost converter, the switching control circuit may comprise: a first voltage detection circuit configured to detect the voltage of the first output terminal of the first boost converter; a second voltage detection circuit configured to detect the voltage of the second output terminal of the second boost converter; a third voltage detection circuit configured to detect the voltage of the third output terminal of the third boost converter; an on time setting circuit configured to set an on time of a control clock signal such that a longer on time is set corresponding to a longer elapsed time since the instruction for operating the integrated circuit in the second mode; and a control clock signal generation circuit configured: to generate a control clock signal of predetermined first on time and first off time and perform switching control of the first field-effect transistor using the generated clock signal, when the detected voltage of the first output terminal of the first boost converter is not higher than the predetermined low voltage; to generate a control clock signal of predetermined second on time and second off time and perform switching control of the second field-effect transistor using the generated clock signal, until the detected voltage of the second output terminal of the second boost converter reaches the first control voltage, after the detected voltage of the first output terminal of the first boost converter reaches the predetermined low voltage; and to generate a control clock signal of the on time set by the on time setting circuit and a predetermined third off time and perform switching control of the third field-effect transistor using the generated clock signal, until the detected voltage of the third output terminal of the third boost converter reaches the second control voltage, after the detected voltage of the second output terminal of the second boost converter reaches the first control voltage. The higher voltage of the third output terminal of the third boost converter is expected to cause the greater energy loss of the third field-effect transistor in the boost-up process and result in the insufficient boost-up in the case of the short on time of the control clock signal. The on time of the control clock signal is set to be longer corresponding to the longer elapsed time. Until the detected voltage of the third output terminal of the third boost converter reaches the second control voltage, the control clock signal of the on time set by the on time setting circuit and the predetermined third off time is generated, and the third field-effect transistor is subjected to switching control using the generated clock signal. This enables the voltage of the third output terminal to be more adequately boosted up to the operating voltage.

In the integrated circuit device of the invention according to the embodiment including the third boost converter, the integrated circuit mounted on the integrated circuit chip may be an NAND-type flash memory consisting of a plurality of flash memory cells, each having a control gate and a floating gate and being capable of reading and writing data according to a voltage applied to the control gate; the first mode may be a mode of performing a reading operation of reading data from the NAND-type flash memory; the second mode may be a mode of performing a writing operation of writing data into the NAND-type flash memory; the first control voltage may be specified in advance as a voltage applied to a control gate of a different flash memory cell from a flash memory cell, from which data is read out by the reading operation; and the second control voltage may be specified in advance as a voltage applied to a control gate of a different flash memory cell from a flash memory cell, into which data is written by the reading operation. When the integrated circuit is the NAND-type flash memory consisting of the plurality of flash memory cells, this enables the voltage applied to the control gate of the different flash memory cell from the flash memory cell, from which data is read out, or the voltage applied to the control gate of the different flash memory cell from the flash memory cell, into which data is written, to be more quickly supplied to the integrated circuit, while ensuring protection of the device.

In the integrated circuit device of the invention, the integrated circuit mounted on the integrated circuit chip may be a flash memory.

DESCRIPTION OF EMBODIMENTS

The following describes the invention with reference to embodiments.

Figure 1:
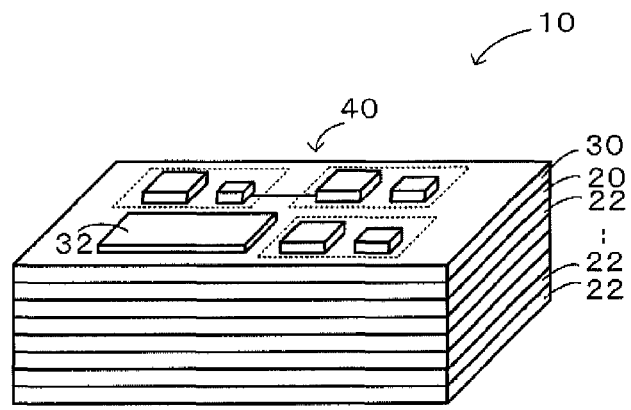
FIG. 1 is a block diagram illustrating the schematic configuration of an SSD 10 as an internal storage device of a computer according to one embodiment of the invention.

FIG. 1 is a block diagram illustrating the schematic configuration of an SSD (Solid Stated Disk 19 as an internal storage device of a computer according to one embodiment of the invention. The SSD 10 includes: a DRAM chip 20 as a silicon chip equipped with a DRAM (Dynamic Random Access Memory); a plurality of stacked flash memory chips 22 provided as silicon chips, each being equipped with a NAND-type flash memory; and an interposer 30 placed on the top-most face. A voltage V0 (for example, 1.6 V, 1.8 V or 2.0 V) as a power source voltage is supplied from a non-illustrated external power source to the SSD 10. According to this embodiment, the DRAM mounted on the DRAM chip 20 operates at the voltage V0. The flash memory mounted on the flash memory chip 22 has a voltage V1 (for example, 9.0 V, 10.0 V or 11.0 V) as a read voltage and a voltage V2 (for example, 18 V, 20 V or 22 V) as a write voltage. Non-illustrated through holes are formed in the DRAM chip 20 and in the flash memory chips 22 to pass through from the surface to the rear face of each chip. The DRAM chip 20 and the flash memory chips 22 are electrically connected via connection lines formed by a metal material having relatively high electrical conductivity (for example, copper) embedded in the through holes.

Figure 2:
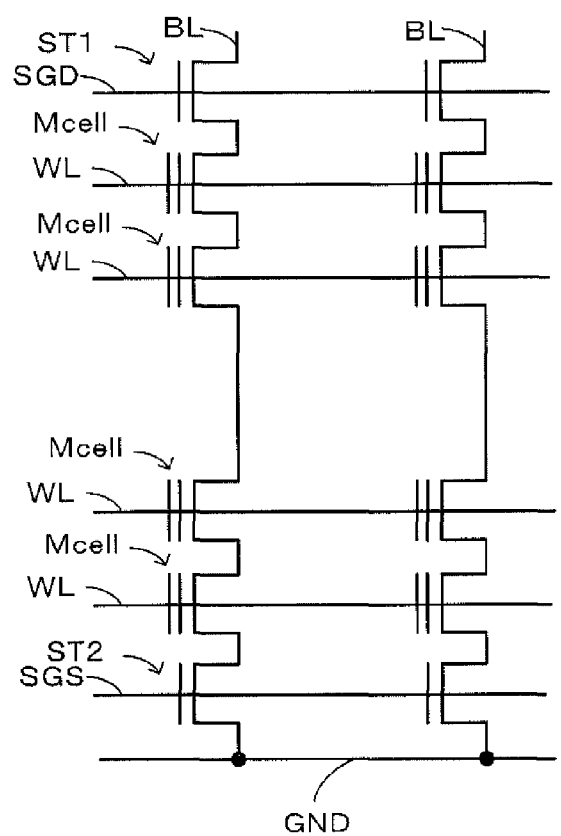
FIG. 2 is a circuit diagram illustrating the schematic configuration of a main part of an NAND-type flash memory mounted on a flash memory chip 22.

FIG. 2 is a circuit diagram illustrating the schematic configuration of a main part of the NAND-type flash memory mounted on the flash memory chip 22. In the flash memory, memory cells Mcell, each having a control gate and a floating gate, are connected with word lines WL between a bit line BL and a ground GND, such that the drain of one memory cell Mcell is connected with the source of an adjacent memory cell Mcell. Selection MOS transistors ST1 and ST2 having respective gates connected with selection gate lines SGD and SGS are placed on both ends of the serially connected memory cells Mcell. In order to read out data stored in the flash memory, the procedure supplies a voltage of 0 V to the word line WL connected with a memory cell Mcell as a reading subject, while supplying the voltage V1 to the word lines WL connected with the respective memory cells Mcell other than the reading subject and to the selection gate lines SGD and SGS of the two selection MOS transistors ST1 and ST2, so that a voltage corresponding to data stored in the memory cell Mcell as the reading subject is output to the bit line BL. This operation enables stored data to be read out. In order to write data into the flash memory, on the other hand, the procedure sets a voltage of 0 V to the word line WL connected with a control gate of a memory cell Mcell as a data writing subject and the selection gate line SGS of the selection MOS transistor ST2 having its source grounded, while supplying the voltage V2 to the word lines WL connected with respective control gates of the other memory cells Mcell and the selection gate line SGD of the selection MOS transistor ST1, so that data corresponding to a voltage of the bit line BL is stored in the memory cell Mcell as the writing subject.

The interposer 30 is equipped with a NAND controller 32 configured to control the flash memory mounted on the flash memory chip 22, a booster circuit 40 configured to boost up the voltage V0 supplied from the power source to the voltage V1 or the voltage V2 and supply the boosted-up voltage to the flash memory chip 22, and connection lines (not shown) from the booster circuit 40 and the NAND controller 32.

Figure 3:
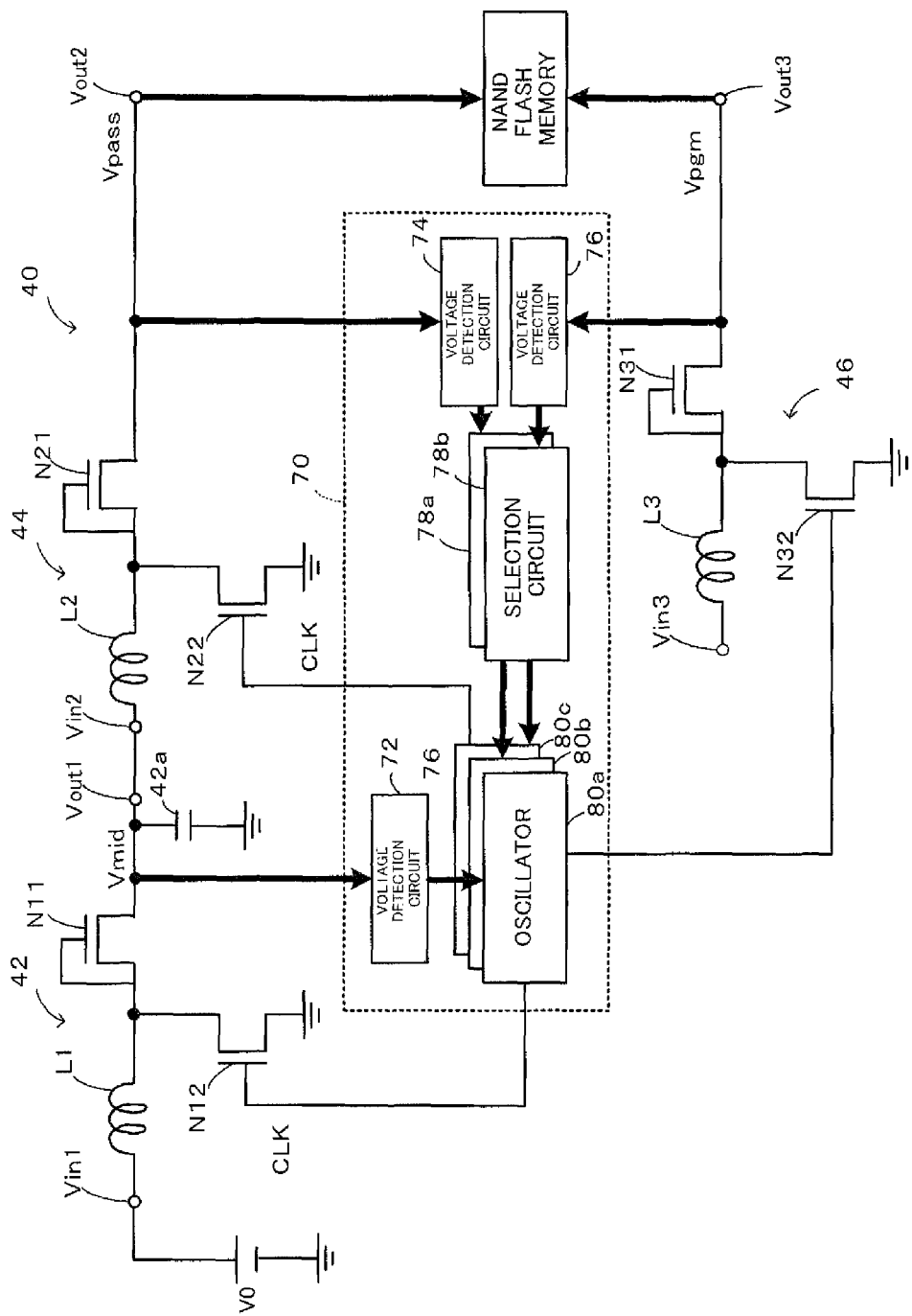
FIG. 3 is a circuit diagram illustrating the schematic configuration of a booster circuit 40 mounted on an interposer 30.

FIG. 3 is a circuit diagram illustrating the schematic configuration of the booster circuit 40 mounted on the interposer 30. The booster circuit 40 includes: a boost converter 42 configured to boost up the voltage V0 supplied to an input terminal Vin1 and output the boosted-up voltage as a voltage Vmid from an output terminal Vout1; a boost converter 44 configured to boost up the voltage supplied from the output terminal Vout1 of the boost converter 42 and supply the boosted-up voltage from an output terminal Vout2 to the flash memory; a boost converter 46 configured to boost up the voltage V0 supplied to an input terminal Vin3 and supply the boosted-up voltage from an output terminal Vout3 to the flash memory; and a switching control circuit 70 configured to control the boost converters 42, 44 and 46 using a control clock signal CLK.

The boost converter 42 includes: an inductor L1 connected in series between the input terminal Vin1 and the output terminal Vout1; an enhancement-type NMOS (N-channel Metal Oxide Semiconductor) transistor N11 (hereinafter referred to as transistor N11) where the gate and the source are interconnected, the source is connected with the inductor L1 and the drain is connected with the output terminal Vout1; and a depression-type NMOS transistor N12 (hereinafter referred to as transistor N12) placed between the inductor L1 and the transistor N11 and connected in parallel with the output terminal Vout1 viewed from the inductor L1. Switching of the transistor N12 is controlled by the control clock signal CLK from the switching control circuit 70. A smoothing capacitor 42a is connected with the output terminal Vout1 to smoothen the voltage of the output terminal Vout1. The transistors N11 and N12 are structured as transistors that withstand a slightly higher voltage than a voltage Vm (for example, 3.6 V, 3.8 V or 4.0 V) specified as a voltage between the voltage V0 and the voltage V1.

The boost converter 44 includes: an inductor L2 connected in series between the input terminal Vin2, which is connected with the output terminal Vout1 of the boost converter 42, and the output terminal Vout2; an enhancement-type NMOS transistor N21 (hereinafter referred to as transistor N21) where the gate and the source are interconnected, the source is connected with the inductor L2 and the drain is connected with the output terminal Vout2; and a depression-type NMOS transistor N22 (hereinafter referred to as transistor N22) placed between the inductor L2 and the transistor N21 and connected in parallel with the output terminal Vout2 viewed from the inductor L2. Switching of the transistor N22 is controlled by the control clock signal CLK from the switching control circuit 70. The transistors N21 and N22 are structured as transistors that have higher threshold voltages than those of the transistors N11 and N12 and withstand a slightly higher voltage than the voltage V1.

The boost converter 46 includes: an inductor L3 connected in series between the input terminal Vin3 receiving a supply of the voltage V0 and the output terminal Vout3; an enhancement-type NMOS transistor N31 (hereinafter referred to as transistor N31) where the gate and the source are interconnected, the source is connected with the inductor L3 and the drain is connected with the output terminal Vout3; and a depression-type NMOS transistor N32 (hereinafter referred to as transistor N32) placed between the inductor L3 and the transistor N31 and connected in parallel with the output terminal Vout3 viewed from the inductor L3. Switching of the transistor N32 is controlled by the control clock signal CLK from the switching control circuit 70. The transistors N31 and N32 are structured as transistors that have higher threshold voltages than those of the transistors N11 and N12 and withstand a slightly higher voltage than the voltage V2.

The switching control circuit 70 includes: a voltage detection circuit 72 configured to detect the voltage Vmid of the output terminal Vout1 of the boost converter 42; a voltage detection circuit 74 configured to detect a voltage Vpass of the output terminal Vout2 of the boost converter 44; a voltage detection circuit 76 configured to detect a voltage Vpgm of the output terminal Vout3 of the boost converter 46; a selection circuit 78a configured to select an on time Ton (time when the control clock signal CLK is a signal of a high-level logic voltage) and an off time Toff (time when the control clock signal CLK is a signal of a low-level logic voltage) of the control clock CLK, based on the voltage Vpass detected by the voltage detection circuit 74; a selection circuit 78b configured to select the on time Ton and the off time Toff, based on the voltage detected by the voltage detection circuit 76; an oscillator 80a configured to generate a control clock signal CLK having the on time Ton and the off time Toff corresponding to the voltage Vmid of the output terminal Vout1 of the boost converter 42 and output the generated control clock signal CLK to the transistor N12 of the boost converter 42; an oscillator 80b configured to generate a control clock signal CLK having the on time Ton and the off time Toff selected by the selection circuit 78a and output the generated control clock signal CLK to the transistor N22 of the boost converter 44; and an oscillator 80c configured to generate a control clock signal CLK having the on time Ton and the off time Toff selected by the selection circuit 78b and output the generated control clock signal CLK to the transistor N32 of the boost converter 46.

The selection circuit 78a specifies in advance by experiments or simulation and stores a relationship between the on time Ton and the off time Toff of the control clock signal CLK which enable the voltage of the output terminal Vout2 to be boosted up relatively quickly and with less power consumption when the voltage Vmid detected by the voltage detection circuit 72 reaches a voltage Vm, and the voltage Vpass of the output terminal Vout2. The selection circuit 78a selects the on time Ton and the off time Toff stored corresponding to the voltage Vpass detected by the voltage detection circuit when the voltage Vmid detected by the voltage detection circuit 72 exceeds the voltage Vm, and outputs the selected on time Ton and off time Toff to the oscillator 80b. The selection circuit 78a outputs a standby signal STB to the oscillator 80b when the voltage Vpass detected by the voltage detection circuit 74 exceeds the voltage V1.

The selection circuit 78b specifies in advance by experiments or simulation and stores in advance a relationship between the on time Ton and the off time Toff of the control clock signal CLK which enable the voltage of the output terminal Vout3 to be boosted up quickly, and the elapsed time since a writing request for writing data into the flash memory, and outputs the stored on time Ton and off time Toff to the oscillator 80c. The longer on time Ton of the control clock signal CLK is set corresponding to the longer elapsed time since the writing request for writing data into the flash memory, while the off time Toff of the control clock signal CLK is set to be constant irrespective of the elapsed time. The reason why the on time Ton and the off time Toff are set in this manner will be described later. The selection circuit 78b outputs a standby signal STB to the oscillator 80c when the voltage Vpgm detected by the voltage detection circuit 76 exceeds the voltage V2.

The oscillator 80a is structured as a known oscillator circuit that generates a control clock signal CLK of predetermined on time and off time and outputs the generated control clock signal CLK to the transistor N11 of the boost converter 42. When the voltage Vmid of the output terminal Vout1 detected by the voltage detection circuit 72 is not higher than the voltage Vm, the oscillator 80a generates a control clock signal CLK of predetermined on time and off time and outputs the generated control clock signal CLK to the transistor N12 of the boost converter 42. When the voltage Vmid of the output terminal Vout1 detected by the voltage detection circuit 72 exceeds the voltage Vm, the oscillator 80a generates a control clock signal CLK fixed to a low level logic voltage (for example, 0 V) to turn off the gate of the transistor N11 and outputs the generated control clock signal CLK to the transistor N12 of the boost converter 42.

Figure 4:
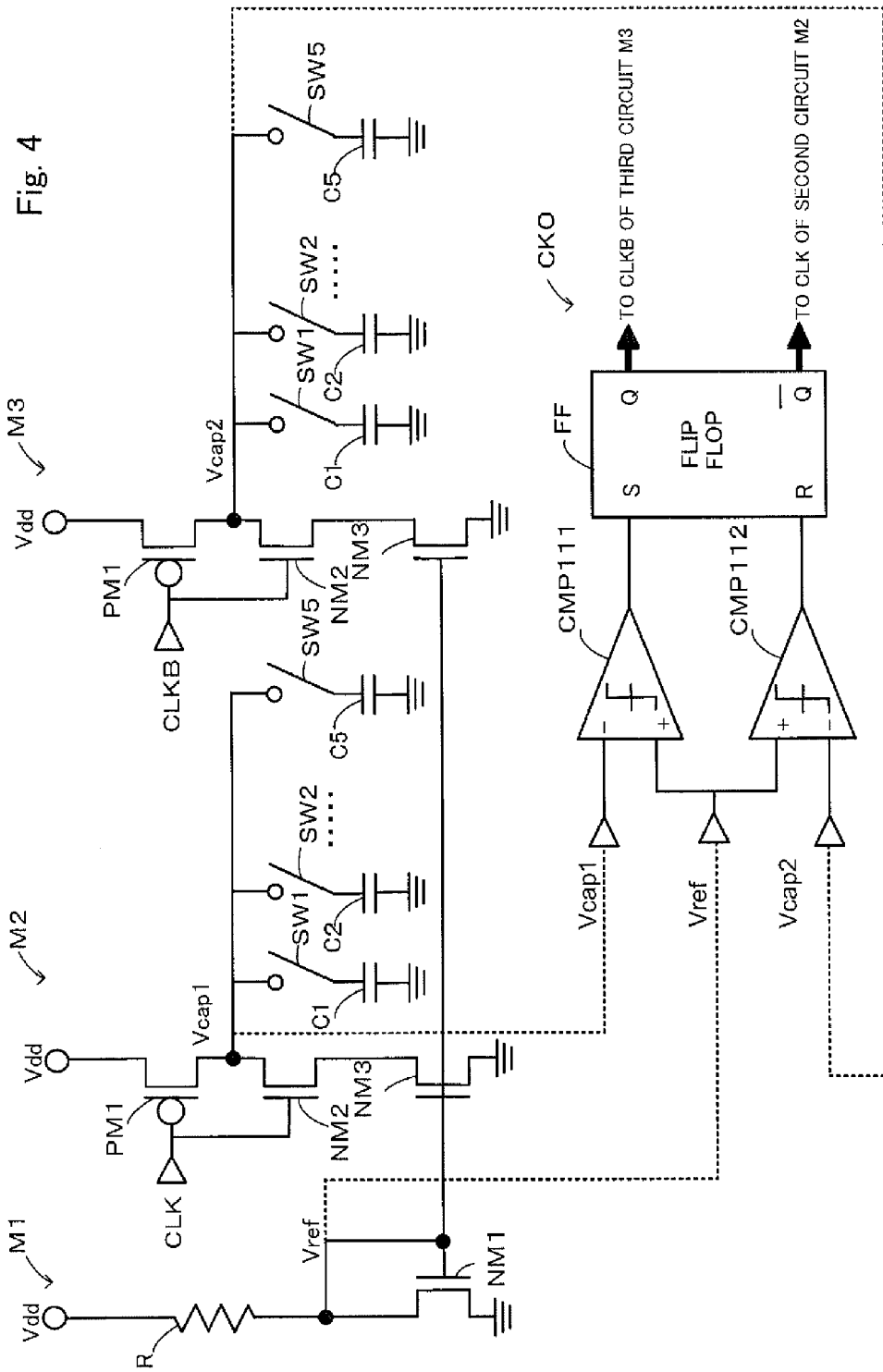
FIG. 4 is a circuit diagram illustrating the schematic configuration of oscillators 80b and 80c.

FIG. 4 is a circuit diagram illustrating the schematic configuration of the oscillators 80b and 80c. As illustrated, each of the oscillators 80b and 80c includes: a first circuit M1 configured as a constant current circuit; a second circuit M2 and a third circuit M3 combined with the first circuit M1 to form a current mirror; and a clock signal output circuit CKO configured to generate and output a control clock signal CLK from the outputs of the first circuit M1 and the second circuit M2. The first circuit M1 includes: a resistor R; and an NMOS transistor NM1 where a power source voltage Vdd is supplied to the drain via the resistor R, the gate and the drain are interconnected, and the source is grounded. The second circuit M2 and the third circuit M3 have the same configuration and respectively include: a PMOS (P-channel Metal Oxide Semiconductor) transistor PM1 where the power source voltage Vdd is supplied to the source; an NMOS transistor NM2 where the gate and the drain are respectively connected with the gate and the drain of the transistor PM1; and an NMOS transistor NM3 where the gate is connected with the gate of the transistor NM 1 and the drain is connected with the drain of the transistor NM2. Capacitors C1 to C5 are connected in parallel via switches SW1 to SW5 between the drain of the transistor PM1 of the second circuit M2 or the third circuit M3 and the ground. The clock signal output circuit CKO includes: a comparator CMP 111 configured to compare a reference voltage Vref, which is the voltage between the drain of the transistor NM 1 of the first circuit M1 and the ground, with the voltage between the drain of the transistor PM1 of the second circuit M2 and the ground, i.e., a capacitor voltage Vcap1 as an inter-electrode voltage of the capacitors C1 to C5 and output the result of the comparison; a comparator CMP 112 configured to compare the reference voltage Vref with the voltage between the drain of the transistor PM1 of the third circuit M3 and the ground, i.e., a capacitor voltage Vcap2 as an inter-electrode voltage of the capacitors C1 to C5 and output the result of the comparison; and a flip flop FF configured to be set or reset according to the results of the comparisons from the CPMs 111 and 112. The flip flop FF is set to output a signal of a low level logic voltage as the control clock signal CLK when the capacitor voltage Vcap1 is not higher than the reference voltage Vref, while being reset to output a signal of a high level logic voltage as the control clock signal CLK and also output a reverse-phase clock signal CLKB reverse to this control clock signal CLK when the capacitor voltage Vcap2 is not higher than the reference voltage Vref. Each of the oscillators 80b and 80c also has a non-illustrated transistor configured to fix the voltage of the control clock signal CLK to the low level logic voltage when the standby signal STB is input from the selection circuit 78a or 78b. In the oscillator 80b or 80c configured as described above, the on time Ton and the off time Toff of the control clock signal CLK output from the selection circuit 78a or 78b are determined from a resistance value R of the resistor R and a composite capacitance C of the capacitors connected with on-switches among the switches SW1 to SW5 of the second circuit M2 and the third circuit M3. The control clock signal CLK of desired on time and off time can be output by controlling the on-off of the switches SW1 to SW5.

The booster circuit 40 of the SSD 10 configured as described above performs a boost-up operation described below, in response to a reading request for reading data from the flash memory mounted on the flash memory chip 22. In response to the reading request, when the voltage Vmid of the output terminal Vout1 detected by the voltage detection circuit 72 is not higher than the voltage V1, the oscillator 80a generates a control clock signal CLK of predetermined on time and off time and outputs the generated control clock signal CLK to the transistor N12 of the boost converter 42 to perform switching control of the transistor N12. This enables the voltage Vmid of the output terminal Vout1 to be boosted up in a stepwise manner. The transistor N12 is structured as a transistor having a lower threshold voltage than that of the transistor N22, so that the boost converter 42 can boost up the voltage Vmid of the output terminal Vout1 to the voltage Vm more quickly, compared with a boost converter using the transistor N22 in place of the transistor N12.

When the voltage Vmid of the output terminal Vout1 reaches the voltage Vm, the oscillator 80a outputs a control clock signal CLK fixed to a predetermined low voltage to turn off the gate of the transistor N12 and thereby stops the boost-up of the output terminal Vout1.

On detection that the voltage detection circuit 72 detects that the voltage Vmid of the output terminal Vout1 reaches the voltage Vm, when the voltage Vpass of the output terminal Vout2 detected by the voltage detection circuit 74 is less than the voltage V1, the selection circuit 78a selects the on time Ton and the off time Toff based on the detected voltage Vpass and outputs the selected on time Ton and off time Toff to the oscillator 80b. The oscillator 80b then generates a control clock signal CLK of the input ON time Ton and off time Toff and outputs the generated control clock signal CLK to the transistor N22 of the boost converter 44 to perform switching control of the transistor N22. This enables the voltage Vpass of the output terminal Vout2 to be boosted up in a stepwise manner. The selection circuit 78a selects the on time Ton and the off time Toff that enable the voltage of the output terminal Vout2 to be boosted up relatively quickly and with less power consumption, and outputs the selected on time Ton and off time Toff to the oscillator 80b, so that the voltage Vpass of the output terminal Vout can be boosted up relatively quickly and with less power consumption. The transistor N22 is structured as a transistor having a higher threshold voltage and withstanding a higher voltage than the transistor N12, so that the boost converter 44 can ensure withstanding the higher voltage, compared with a boost converter using the transistor N12 in place of the transistor N22.

Figure 5:
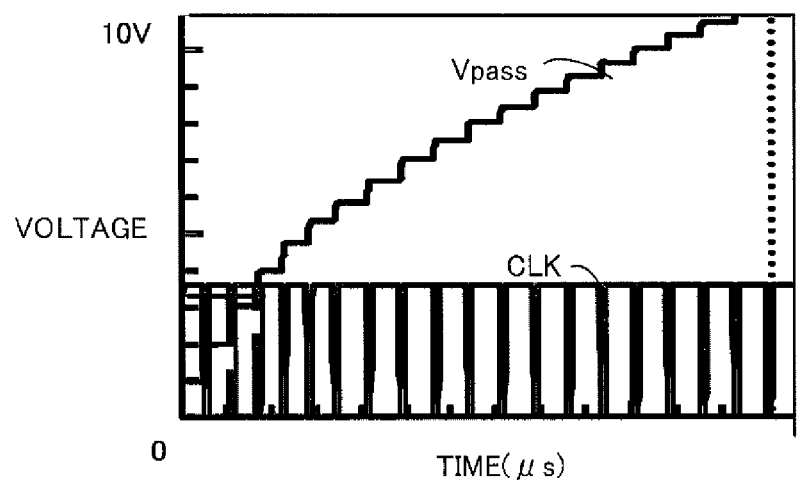
FIG. 5 is a diagram showing one example of time variations in control clock signal CLK and voltage Vpass of an output terminal Vout2.

When the voltage Vpass of the output terminal Vout2 reaches the voltage V1, the selection circuit 78a outputs a standby signal STB, and the oscillator 80b outputs a control clock signal CLK fixed to a low level logic voltage to turn off the gate of the transistor N22 and thereby stops the boost-up of the output terminal Vout2. FIG. 5 shows one example of time variations in control clock signal CLK and voltage Vpass of the output terminal Vout2. This operation can boost up the voltage Vpass of the output terminal Vout2 to the voltage V1 and supply the boosted-up voltage to the flash memory 22.

Figure 6:
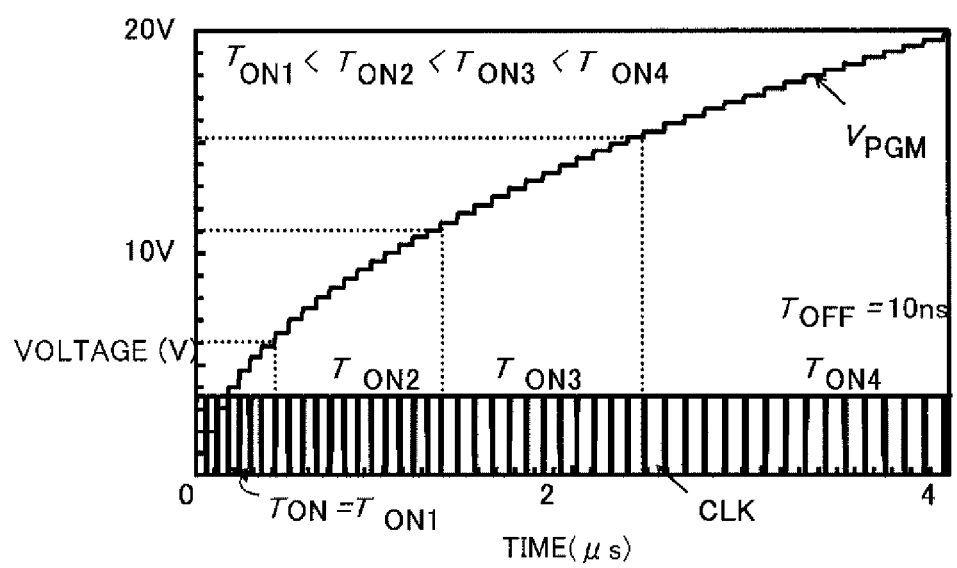
FIG. 6 is a diagram showing one example of time variations in control clock signal CLK and voltage Vpgm of an output terminal Vout3.

The booster circuit 40 of the SSD 10 performs a boost-up operation described below, in response to a writing request for writing data into the flash memory mounted on the flash memory chip 22. In response to the writing request, when the voltage Vpgm of the output terminal Vout2 detected by the voltage detection circuit 76 is less than the voltage V2, the selection circuit 78b selects the on time Ton and the off time Toff of the control clock signal CLK based on the detected voltage Vpgm and outputs the selected on time Ton and off time Tff to the oscillator 80b. The oscillator 80b then generates a control clock signal CLK of the input ON time Ton and off time Toff and outputs the generated control clock signal CLK to the transistor N32 of the boost converter 46 to perform switching control of the transistor N32. The following describes the reason why the selection circuit 78b sets the longer on time Ton of the control clock signal CLK corresponding to the longer elapsed time since the writing request for writing data into the flash memory. The higher voltage of the output terminal Vout of the boost converter 46 causes the greater energy loss of the transistor N32 in the boost-up process and may thus result in the insufficient boost-up in the case of the short on time of the control clock signal CLK. By setting the longer on time Ton of the control clock signal CLK corresponding to the longer elapsed time since the writing request, it is expected to sufficiently boost up the voltage Vpgm of the output terminal Vout3 to the voltage V2. FIG. 6 shows one example of time variations in control clock signal CLK and voltage Vpgm of the output terminal Vout3. This operation can more adequately boost up the voltage Vpgm of the output terminal Vout3 to the voltage V2 and supply the boosted-up voltage to the flash memory 22.

In the SSD 10 of the embodiment described above, in response to a reading request for reading data from the flash memory, when the voltage Vmid of the output terminal Vout1 detected by the voltage detection circuit 72 is not higher than the voltage V1, the oscillator 80a generates a control clock signal CLK of predetermined on time and off time and outputs the generated control clock signal CLK to the transistor N12 of the boost converter 42 to perform switching control of the transistor N12. When the voltage detection circuit 72 detects that the voltage Vmid of the output terminal Vout1 reaches the voltage Vm, the selection circuit 78a selects the on time Ton and the off time Toff that enable the voltage of the output terminal Vout2 to be boosted up quickly and with less power consumption, based on the voltage Vpass of the output terminal Vout2 and outputs the selected on time Ton and off time Toff to the oscillator 80b. The oscillator 80b then generates a control clock signal CLK of the input on time Ton and off time Toff and outputs the generated control clock signal CLK to the transistor N22 of the boost converter 44 to perform switching control of the transistor N22. This enables the voltage Vpass of the output terminal Vout2 to be boosted up to the voltage V1 in a stepwise manner. In response to a writing request for writing data into the flash memory mounted on the flash memory chip 22, on the other hand, when the voltage Vpgm of the output terminal Vout2 detected by the voltage detection circuit 38 is less than the voltage V2, the selection circuit 78b selects the stored on time Ton and off time Toff that enable the voltage of the output terminal Vout2 to be boosted up quickly with less power consumption and outputs the selected on time Ton and off time Toff to the oscillator 80b. The oscillator 80b then generates a control clock signal CLK of the input on time Ton and off time Toff and outputs the generated control clock signal CLK to the transistor N32 of the boost converter 46 to perform switching control of the transistor N32. This operation can more adequately boost up the voltage Vpgm of the output terminal Vout3 to the voltage V3 and supply the boosted-up voltage to the flash memory 22.

In the SSD 10 of the embodiment, the selection circuit 78a selects the on time Ton and the off time Toff that enable the voltage of the output terminal Vout2 to be boosted up quickly with less power consumption, based on the voltage Vpass of the output terminal Vout and outputs the selected on time Ton and off time Toff to the oscillator 80. According to a modification, the off time Toff may be fixed to a certain time, while the on time Ton the off time Toff may be set to be longer corresponding to the longer elapsed time since the reading request for reading data from the flash memory and output to the oscillator 80b. This modification can more adequately boost up the voltage.

In the SSD 10 of the embodiment, the selection circuit 78b specifies in advance by experiments or simulation and stores in advance a relationship between the on time Ton and the off time Toff of the control clock signal CLK which enable the voltage of the output terminal Vout3 to be boosted up quickly, and the elapsed time since a writing request for writing data into the flash memory, and outputs the stored on time Ton and off time Toff to the oscillator 80c. The longer on time Ton of the control clock signal CLK is set corresponding to the longer elapsed time since the writing request for writing data into the flash memory, while the off time Toff of the control clock signal CLK is set to be constant irrespective of the elapsed time. According to a modification, the off time Toff as well as the on time Ton may be varied according to the elapsed time.

In the SSD 10 of the embodiment, the transistors N21 and N22 are structured as transistors that have higher threshold voltages than those of the transistors N11 and N12 and withstand a slightly higher voltage than the voltage V1. The transistors N21 and N22 may, however, be any transistors that have higher threshold voltages than those of the transistors N11 and N12 and withstand the voltage V1 and may be, for example, transistors that withstand a voltage of not lower than the voltage V2. The transistors N31 and N32 are structured as transistors that have higher threshold voltages than those of the transistors N11 and N12 and withstand a slightly higher voltage than the voltage V2. The transistors N31 and N32 may, however, be any transistors that have higher threshold voltages than those of the transistors N11 and N12 and withstand the voltage V2 and may be, for example, transistors that withstand a significantly higher voltage (for example, 30 V) than the voltage V2.

Figure 7:
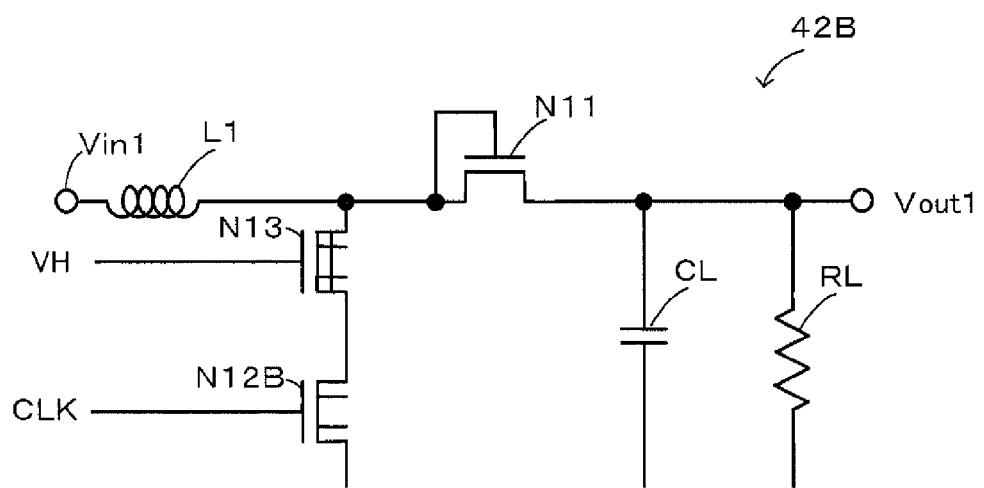
FIG. 7 is a diagram illustrating one example of a boost converter 42B according to a modification.

In the SSD 10 of the embodiment, the boost converter 42 includes the depression-type NMOS transistor N12 placed between the inductor L1 and the transistor N11 and connected in parallel with the output terminal Vout1 viewed from the inductor L1. The boost converter 42 is, however, required to include any element that is placed between the inductor L1 and the transistor N11, is connected in parallel with the output terminal Vout1 viewed from the inductor L1 and is switched by a clock signal CLK. Like a boost converter 42B according to a modification illustrated in FIG. 7, the depression-type NMOS transistor N12 may be replaced with a combination of a depression-type NMOS transistor N13 (hereinafter referred to as transistor N13) connected between the inductor L1 and the transistor N11 and an enhancement-type NMOS transistor N12B (hereinafter referred to as transistor N12B) connected in series with the transistor N13. The voltage of the gate of the transistor N13 may be fixed to a predetermined voltage VH, and the control clock signal CLK may be input into the gate of the transistor N12B. The predetermined voltage VH herein is preferably a voltage (for example, 1.8 V) between the voltage V0 and the voltage Vm. The boost converter 42 includes the enhancement-type NMOS transistor N111 where the gate and the source are interconnected, the source is connected with the inductor L1 and the drain is connected with the output terminal Vout1. The boost converter 42 is, however, required to include a rectifying element connected in series between the inductor L1 and the output terminal Vout1 and configured to rectify the electric current in a direction from the input terminal Vin1 toward the output terminal Vout1 and may thus include a diode in place of the transistor N11. The foregoing describes the boost converter 42 as an example, but the boost converter of the modification illustrated in FIG. 7 or a boost converter of another modification is also applicable to the boost converters 44 and 46.

In the SSD 10 of the embodiment, the interposer 30 is placed on the upper surface of the flash memory chip 22. The interposer 30 may, however, be placed on the lower face of the flash memory chip 22. Another integrated circuit chip or interposer may be laid on the interposer 30.

The SSD 10 of the embodiment includes the flash memory chip 22 equipped with the flash memory. The integrated circuit mounted on such a chip is not limited to the flash memory but may be any integrated circuit that operates at a predetermined voltage.

The invention is applied to the SSD 10 according to the embodiment but may be applied to any integrated circuit device that includes: an integrated circuit chip equipped with an integrated circuit; and an interposer equipped with a booster supply circuit which is capable of boosting up a power source voltage supplied from a power source side and supplying the boosted-up voltage to the integrated circuit of the integrated circuit chip, for example, microcomputer.

The following describes the correspondence relation between the primary components of the embodiment and the primary components of the invention described in SUMMARY OF INVENTION. The flash memory chip 22 of the embodiment corresponds to the "integrated circuit chip". The interposer 30 corresponds to the "interposer". The booster circuit 40 corresponds to the "booster supply circuit". The boost converter 42 including the inductor L1, the transistor N11 and the transistor N12 corresponds to the "first boost converter". The boost converter 44 including the inductor L2, the transistor N21 and the transistor N22 corresponds to the "second boost converter". The switching control circuit 70 corresponds to the "switching control circuit". The voltage detection circuit 72 corresponds to the "first voltage detection circuit", and the voltage detection circuit 74 corresponds to the "second voltage detection circuit". The selection circuit 78a and the oscillators 80a and 80b that generate the control clock signal CLK based on the voltage Vmid of the output terminal Vout1 detected by the voltage detection circuit 72 or the voltage Vpass of the output terminal Vout2 and output the generated control clock signal CLK to the transistor N12 or the transistor N22 to control the transistor N12 or the transistor N22 correspond to the "control clock signal generating circuit". Additionally, the boost converter 46 including the inductor L3, the transistor N31 and the transistor N32 corresponds to the "third boost converter". The voltage detection circuit 76 corresponds to the "third voltage detection circuit". The selection circuit 78b and the oscillator 80c that generate the control clock signal CLK based on the voltage of the output terminal Vout3 detected by the voltage detection circuit 76 and output the generated control clock signal CLK to the transistor N32 to control the transistor N32 correspond to the "control clock signal generating circuit".

The foregoing has described some embodiments of the invention. The invention is, however, not limited to the above embodiments, but a multiplicity of variations and modifications may be made to the embodiments without departing from the scope of the invention.

INDUSTRIAL APPLICABILITY

The invention is applicable to, for example, manufacturing industries of integrated circuit devices.

The invention claimed is:
1. An integrated circuit device that comprises: an integrated circuit chip equipped with an integrated circuit; and an interposer equipped with a booster supply circuit which is capable of boosting up a power source voltage supplied from a power source side and supplying the boosted-up voltage to the integrated circuit of the integrated circuit chip, wherein
the booster supply circuit comprises:
a first boost converter configured to include: a first inductor connected in series between a first input terminal receiving a supply of the power source voltage and a first output terminal outputting a voltage; a first rectifying element connected in series between the first inductor and the first output terminal and configured to rectify electric current in a direction from the first input terminal toward the first output terminal; and a first field-effect transistor placed between the first inductor and the first rectifying element and connected in parallel with the first output terminal viewed from the first inductor;
a second boost converter configured to include: a second inductor connected in series between a second input terminal receiving an input of the voltage of the first output terminal of the first boost converter and a second output terminal supplying a voltage to the integrated circuit of the integrated circuit chip; a second rectifying element connected in series between the second inductor and the second output terminal and configured to rectify electric current in a direction from the second input terminal toward the second output terminal; and a second field-effect transistor placed between the second inductor and the second rectifying element, connected in parallel with the second output terminal viewed from the second inductor and configured to have a higher threshold voltage than the first field-effect transistor and withstand a voltage of not lower than a predetermined operating voltage as a voltage which the integrated circuit operates; and a switching control circuit configured to perform switching control of the first field-effect transistor of the first boost converter to make the voltage of the first output terminal equal to a predetermined low voltage, which is specified in advance as a lower voltage than the operating voltage, when the voltage of the first output terminal of the first boost converter is not higher than the predetermined low voltage, and to perform switching control of the second field-effect transistor of the second boost converter to make the voltage of the second output terminal of the second boost converter equal to the operating voltage after the voltage of the first output terminal of the first boost converter reaches the predetermined low voltage.

2. The integrated circuit device according to claim 1, wherein the switching control circuit comprises:

a first voltage detection circuit configured to detect the voltage of the first output terminal of the first boost converter;

a second voltage detection circuit configured to detect the voltage of the second output terminal of the second boost converter; and a control clock signal generating circuit configured: to generate a control clock signal of predetermined first on time and first off time and perform switching control of the first field-effect transistor by using the generated clock signal, when the detected voltage of the first output terminal of the first boost converter is not higher than the predetermined low voltage; and to generate a control clock signal of predetermined second on time and second off time and perform switching control of the second field-effect transistor using the generated clock signal, after the detected voltage of the first output terminal of the first boost converter reaches the predetermined low voltage.

3. The integrated circuit device according to claim 1, wherein the switching control circuit comprises:

a first voltage detection circuit configured to detect the voltage of the first output terminal of the first boost converter;

a second voltage detection circuit configured to detect the voltage of the second output terminal of the second boost converter;

an on time setting circuit configured to set an on time of a control clock signal such that a longer on time is set corresponding to a longer elapsed time since the detected voltage of the first output terminal of the first boost converter has reached the predetermined low voltage, until the detected voltage of the second output terminal of the second boost converter reaches the operating voltage, after the detected voltage of the first output terminal of the first boost converter reaches the predetermined low voltage; and a control clock signal generating circuit configured: to generate a control clock signal of predetermined first on time and first off time and perform switching control of the first field-effect transistor by using the generated clock signal, when the detected voltage of the first output terminal of the first boost converter is not higher than the predetermined low voltage; and to generate a control clock signal of the on time set by the on time setting circuit and a predetermined second off time and perform switching control of the second field-effect transistor using the generated clock signal, until the detected voltage of the second output terminal of the second boost converter reaches the operating voltage, after the detected voltage of the first output terminal of the first boost converter reaches the predetermined low voltage.

4. The integrated circuit device according to claim 1, further comprising:

a third boost converter configured to include: a third inductor connected in series between a third input terminal receiving a voltage supply from the power source and a third output terminal outputting a voltage to the integrated circuit of the integrated circuit chip; a third rectifying element connected in series between the third inductor and the third output terminal and configured to rectify electric current in a direction from the third input terminal toward the third output terminal; and a third field-effect transistor placed between the third inductor and the third rectifying element and connected in parallel with the third output terminal viewed from the third inductor, wherein the integrated circuit is capable of operating in a first mode that operates with the operating voltage set to a first control voltage and in a second mode that operates with the operating voltage set to a second control voltage higher than the first control voltage, and wherein in response to an instruction for operating the integrated circuit in the first mode, when the voltage of the first output terminal of the first boost converter is not higher than the predetermined low voltage, the switching control circuit performs switching control of the first field-effect transistor of the first boost converter to make the voltage of the first output terminal equal to the predetermined low voltage, and after the voltage of the first output terminal of the first boost converter reaches the predetermined low voltage, the switching control circuit performs switching control of the second field-effect transistor of the second boost converter to make ft the voltage of the second output terminal of the second boost converter equal to the first control voltage, and in response to an instruction for operating the integrated circuit hi the second mode, the switching control circuit performs switching control of the third field-effect transistor of the third boost converter to make the voltage of the third output terminal of the third boost converter equal to the second control voltage.

5. The integrated circuit device according to claim 4, wherein the integrated circuit mounted on the integrated circuit chip is an NAND-type flash memory consisting of a plurality of flash memory cells, each having a control gate and a floating gate and being capable of reading and writing data according to a voltage applied to the control gate, the first mode is a mode of performing a reading operation of reading data from the NAND-type flash memory, the second mode is a mode of performing a writing operation of writing data into the NAND-type flash memory, the first control voltage is specified in advance as a voltage applied to a control gate of a different flash memory cell from a flash memory cell, from which data is read out by the reading operation, and the second control voltage is specified in advance as a voltage applied to a control gate of a different flash memory cell from a flash memory cell, into which data is written by the reading operation.

6. The integrated circuit device according to claim 4, wherein the switching control circuit comprises:

a first voltage detection circuit configured to detect the voltage of the first output terminal of the first boost converter;

a second voltage detection circuit configured to detect the voltage of the second output terminal of the second boost converter;

a third voltage detection circuit configured to detect the voltage of the third output terminal of the third boost converter;

an on time setting circuit configured to set an on time of a control clock signal such that a longer on time is set corresponding to a longer elapsed time; and a control clock signal generation circuit configured: to generate a control clock signal of predetermined first on time and first off time and perform switching control of the first field-effect transistor using the generated clock signal, when the detected voltage of the first output terminal of the first boost converter is not higher than the predetermined low voltage; to generate a control clock signal of predetermined second on time and second off time and perform switching control of the second field-effect transistor using the generated clock signal, after the detected voltage of the first output terminal of the first boost converter reaches the predetermined low voltage; and to generate a control clock signal of the on time set by the on time setting circuit and a predetermined third off time and perform switching control of the third field-effect transistor using the generated clock signal, until the detected voltage of the third output terminal of the third boost converter reaches the second control voltage, after the detected voltage of the second output terminal of the second boost converter reaches the first control voltage.

7. The integrated circuit device according to claim 6, wherein the integrated circuit mounted on the integrated circuit chip is an NAND-type flash memory consisting of a plurality of flash memory cells, each having a control gate and a floating gate and being capable of reading and writing data according to a voltage applied to the control gate, the first mode is a mode of performing a reading operation of reading data from the NAND-type flash memory, the second mode is a mode of performing a writing operation of writing data into the NAND-type flash memory, the first control voltage is specified in advance as a voltage applied to a control gate of a different flash memory cell from a flash memory cell, from which data is read out by the reading operation, and the second control voltage is specified in advance as a voltage applied to a control gate of a different flash memory cell from a flash memory cell, into which data is written by the reading operation.

8. The integrated circuit device according to claim 1, wherein the integrated circuit mounted on the integrated circuit chip is a flash memory.

\* \* \* \* \*